United States Patent [19]
Yi et al.

[11] Patent Number: 5,877,991
[45] Date of Patent: Mar. 2, 1999

[54] VARIABLE COMPARISON VOLTAGE GENERATION APPARATUS FOR GENERATING A COMPARISON VOLTAGE CORRESPONDING TO A VARIATION OF ELECTRIC CHARGE QUANTITY IN A FERROELECTRIC SUBSTANCE MEMORY ELEMENT

[75] Inventors: Seung Hyun Yi; Jae Hwan Kim, both of Ichon, Rep. of Korea

[73] Assignee: Hyundai Electronics Industries Co., Ltd., Ichon, Rep. of Korea

[21] Appl. No.: 57,614

[22] Filed: Apr. 8, 1998

[30] Foreign Application Priority Data

Apr. 9, 1997 [KR] Rep. of Korea ............ 97-12989

[51] Int. Cl.⁶ ................................................ G11C 16/04
[52] U.S. Cl. ............... 365/189.07; 365/145; 365/149; 365/189.07; 365/189.09; 365/207
[58] Field of Search ............................ 365/149, 145, 365/189.07, 189.09, 207

[56] References Cited

U.S. PATENT DOCUMENTS

| | | | |
|---|---|---|---|
| 5,218,566 | 6/1993 | Papaliolios | 365/145 |
| 5,373,477 | 12/1994 | Sugibayashi | 365/226 |
| 5,532,953 | 7/1996 | Ruesch et al. | 365/145 |
| 5,532,968 | 7/1996 | Lee | 385/222 |
| 5,541,872 | 7/1996 | Lowrey et al. | 365/145 |

*Primary Examiner*—David Nelms
*Assistant Examiner*—Van Thu Nguyen
*Attorney, Agent, or Firm*—Thelen Reid & Priest LLP

[57] ABSTRACT

A variable comparison voltage generation apparatus for a semiconductor memory element substitutes a variable comparison voltage amplifier for a fixed comparison voltage amplifier used for a ferroelectric substance memory. The variable comparison voltage generation apparatus according to the present invention accurately detect the data stored in the memory element with ferroelectric substance.

7 Claims, 4 Drawing Sheets

VARIABLE COMPARISON VOLTAGE GENERATION APPARATUS FOR GENERATING A COMPARISON VOLTAGE CORRESPONDING TO A VARIATION OF ELECTRIC CHARGE QUANTITY IN A FERROELECTRIC SUBSTANCE MEMORY ELEMENT

BACKGROUND OF THE INVENTION

1. Field of the Invention

The present invention relates to a variable comparison voltage generation apparatus for a semiconductor memory element. More particularly, it relates to a variable comparison voltage generation apparatus for a semiconductor memory element which maintains information safely although the number of times a ferroelectric substance memory element is usae becomes increased, and thereby accurately discriminates the data value in the memory element.

2. Description of the Prior Art

Generally, a semiconductor memory element memorizes information as two states according to an electric charge quantity therein. A comparison voltage amplifier is required for discriminating between the two-states of information and transmitting it to the outside. Accordingly, a comparison voltage is needed for the comparison voltage amplifier.

However, a memory element with a ferroelectric substance has a lower electric charge quantity, as its amount of usage is increased.

If the electric charge quantity decreases, a voltage value applied to an external voltage amplifier also decreases. Accordingly, it is difficult to accurately discriminate between voltages(information) stored in the memory element, so the memory element is not reliable.

In a conventional comparison voltage generation apparatus having a fixed comparison voltage, if a ferroelectric substance memory element is used in memory device, electric charge quantity decreases because the number of times the memory element is used, increases. Therefore, the conventional comparison voltage generation apparatus cannot accurately discriminate between the two voltages stored in the memory element, thereby incorrectly transmitting the stored information to an external part.

SUMMARY OF THE INVENTION

Accordingly, the present invention is directed to a variable comparison voltage amplifier that substantially obviates one or more of the problems which arise due to limitations and disadvantages of the related art. That is, the present invention substitutes a variable comparison voltage amplifier for the conventional fixed comparison voltage amplifier.

An objective of the present invention is to provide a variable comparison voltage generator which prevents information distortion generated because electric charge quantity decreases as the amount of usage of a ferroelectric substance memory element increases, thereby accurately discriminating between the information stored in the memory element.

To achieve the above objective, a variable comparison voltage generator which senses a variation of electric charge quantity in ferroelectric substance memory elements and generates a variable comparison voltage corresponding to the variation of electric charge quantity includes:

a variable comparison voltage generation controller 10 including: N variable comparison voltage generation controllers which sense the variation of electric charge quantity in the ferroelectric substance memory elements and generate N first logic signals (D1–D8); and a plurality of AND gates which receive two logic signals adjacent to each other among the N first logic signals (D1–D8) and generate N/2 second logic signals; and a variable comparison voltage generator 20 including: a plurality of switches which are turned on or off by the N/2 second logic signals being output signals of the variable comparison voltage generation controller 10; capacitors which are connected to the switches; and another ferroelectric substance memory element which is operated by a predetermined control signal.

The variable comparison voltage is determined by adding an electric charge quantity generated from the capacitors connected to the switches turned on to an electric charge quantity generated from the other ferroelectric substance memory element, that is, the variable comparison voltage is determined by a total electric charge quantity of an electric charge quantity generated from the capacitors and the electric charge quantity generated from the other ferroelectric substance memory element.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide further understanding of the invention and are incorporated in and constitute a part of this specification, illustrate embodiments of the invention and together with the description-serve to explain the principles of the drawings:

DETAILED DESCRIPTION OF THE PREFERRED EMBODIMENTS

Reference will now be made in detail to the preferred embodiments of the present invention, examples of which are illustrated in the accompanying drawings.

Figure 1:
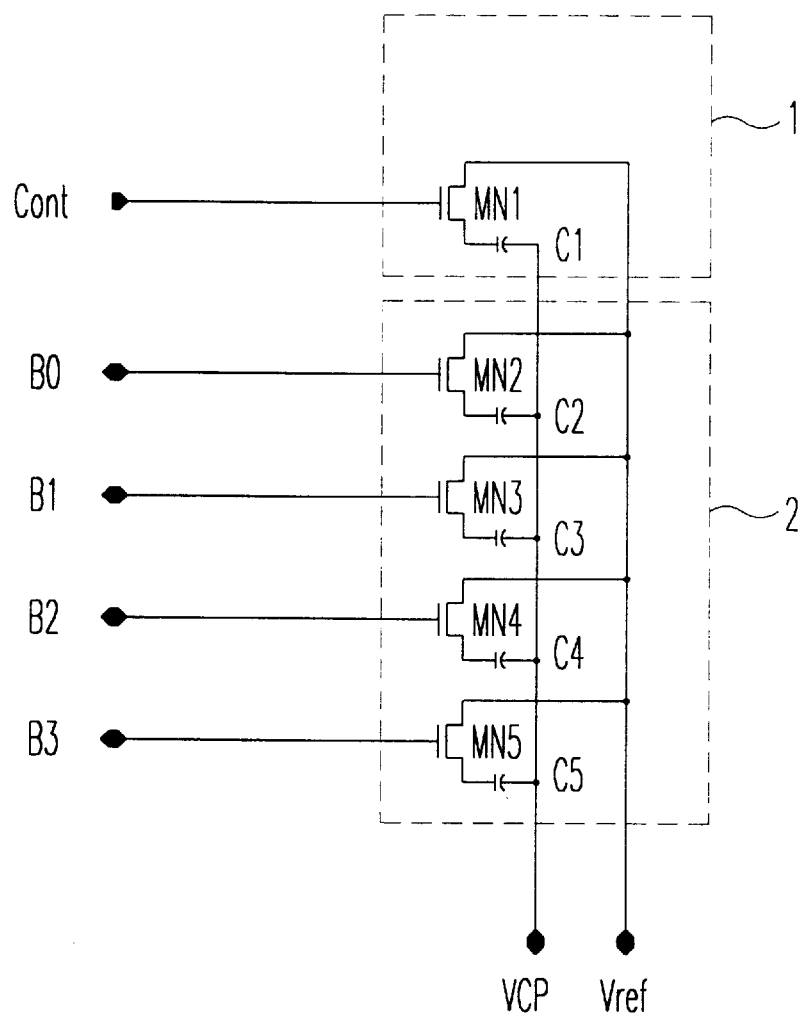
FIG. 1 is a circuit diagram illustrating a comparison voltage generator in accordance with a preferred embodiment of the present invention.

FIG. 1 is a circuit diagram illustrating a comparison voltage generator in accordance with a preferred embodiment of the present invention.

The comparison voltage generator includes: a ferroelectric substance memory element 1 which is operated by a control signal Cont, and outputs stored data to a comparison voltage terminal Vref; and a silicon condenser 2 which is operated by predetermined signals B0–B3, and outputs the data stored in the capacitors C2–C5 to the comparison voltage terminal Vref.

The ferroelectric substance memory element 1 includes: n-channel metal oxide semiconductor (hereinafter referred to as a NMOS) transistor MN1 which receives the control signal Cont through a gate terminal and is connected between the comparison voltage terminal Vref and one terminal of the capacitor C1; and a capacitor C1 which is connected between a source terminal of the NMOS transistor MN1 and a cell plate voltage terminal VCP.

The silicon condenser 2 includes: NMOS transistor MN2 which receives a signal B0 through a gate terminal, and is connected between the comparison voltage terminal Vref and one terminal of a capacitor C2; a capacitor C2 which is connected between a source terminal of the NMOS transistor MN2 and the cell plate voltage terminal VCP; NMOS transistor MN3 which receives a signal B1 through a gate terminal, and is connected between the comparison voltage terminal Vref and one terminal of a capacitor C3; a capacitor C3 which is connected between a source terminal of NMOS transistor MN3 and the cell plate voltage terminal VCP; NMOS transistor MN4 which receives a signal B2 through a gate terminal, and is connected between the comparison voltage terminal Vref and one terminal of a capacitor C4; a capacitor C4 which is connected between a source terminal of NMOS transistor MN4 and the cell plate voltage terminal VCP; NMOS transistor MN5 which receives a signal B3 through a gate terminal, and is connected between the comparison voltage terminal Vref and one terminal of a capacitor C5; and a capacitor C5 which is connected between a source terminal of NMOS transistor MN5 and the cell plate voltage terminal VCP.

The ferroelectric substance memory element 1 stores a low electric charge quantity, and the silicon condenser 2 stores a high electric charge quantity. The electric charge quantity stored in the silicon condenser 2 is one eighth (1/8) of the difference between the high electric charge quantity and low electric charge quantity in the ferroelectric substance memory element 1. At this time, the low electric charge quantity in the silicon condenser 2 is constant irrespective of the amount of usage unlike the electric charge quantity in the ferroelectric substance memory element 1.

If the control signals Cont and the signals B0–B3 are enabled, the electric charge quantity generated from the silicon condenser 2 becomes a value which is made by adding four eighths (4/8) of an entire electric charge quantity of the silicon condenser 2 to the low electric charge quantity in the ferroelectric substance memory element 1. Also, if the control signal Cont and the signals B0–B2 are enabled, the electric charge quantity generated from the silicon condenser 2 becomes another value which is made by adding three eighths (3/8) of the entire electric charge quantity of the silicon condenser 2 to the low electric charge quantity in the ferroelectric substance memory element 1.

Accordingly, if the electric charge quantity generated from the silicon condenser 2 is controlled by the signals Cont and B0–B3, an output electric charge quantity of the comparison voltage generator is changed, thereby its output reference voltage is also changed. The signals B0–B3 are controlled by the comparison voltage generation controller 10 shown in FIG. 3. In general, the reference voltage generated from the comparison voltage generator becomes low with the lapse of time, because an electric charge quantity in the ferroelectric substance memory element 1 is lowered in proportion to the number of usage. Therefore, the signals B0, B1, B2 and B3 are gradually turned off with the lapse of time, thereby lowering the comparison voltage.

Figure 3:
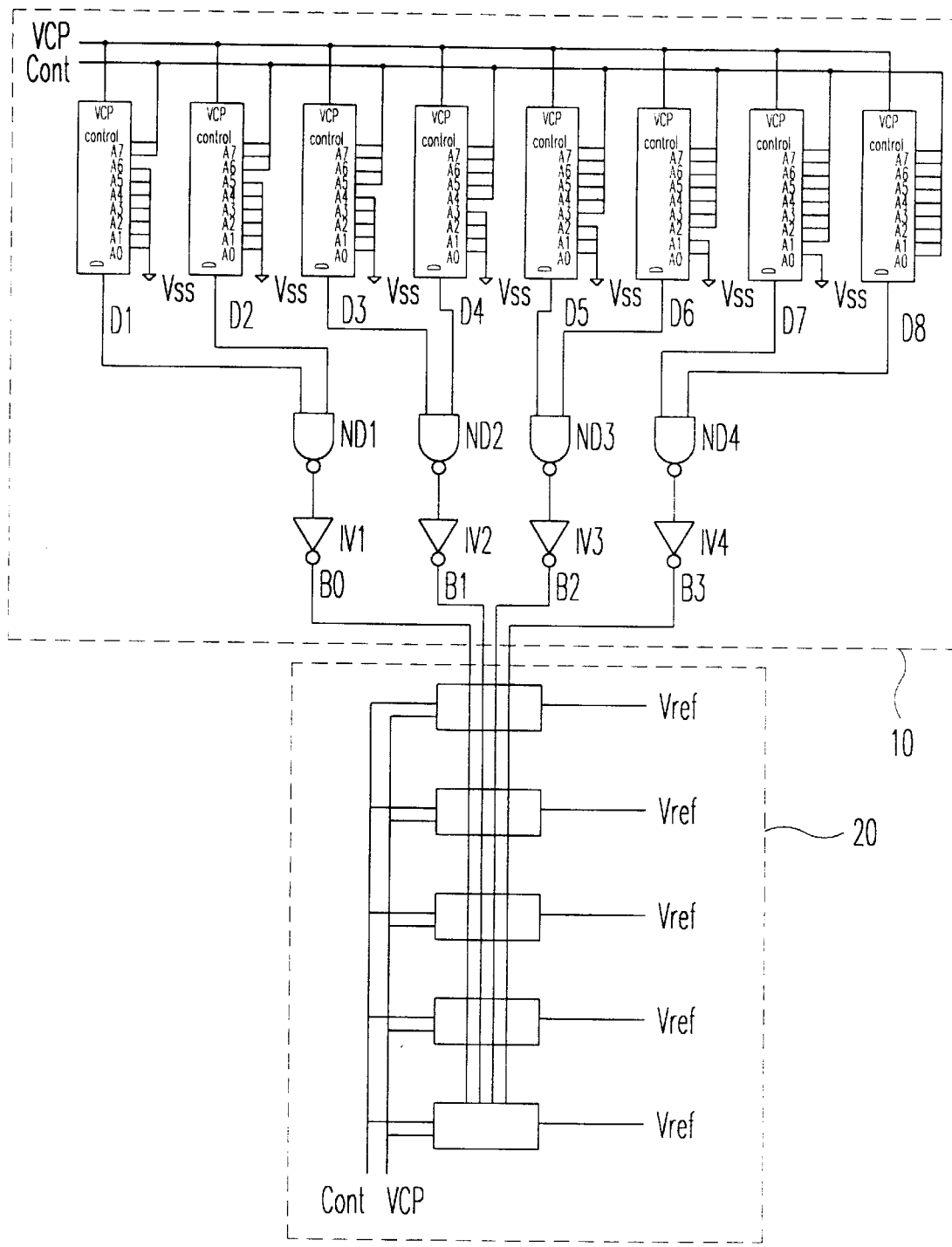
FIG. 3 is a circuit diagram illustrating a variable comparison voltage generation apparatus which includes a plurality of comparison voltage generators and a plurality of comparison voltage generation controllers.

The signals B0,B1,B2 and B3 input to the silicon condenser 2 are second variable comparison voltage generation control signals shown in FIG. 3, a description of them follows.

Figure 2:
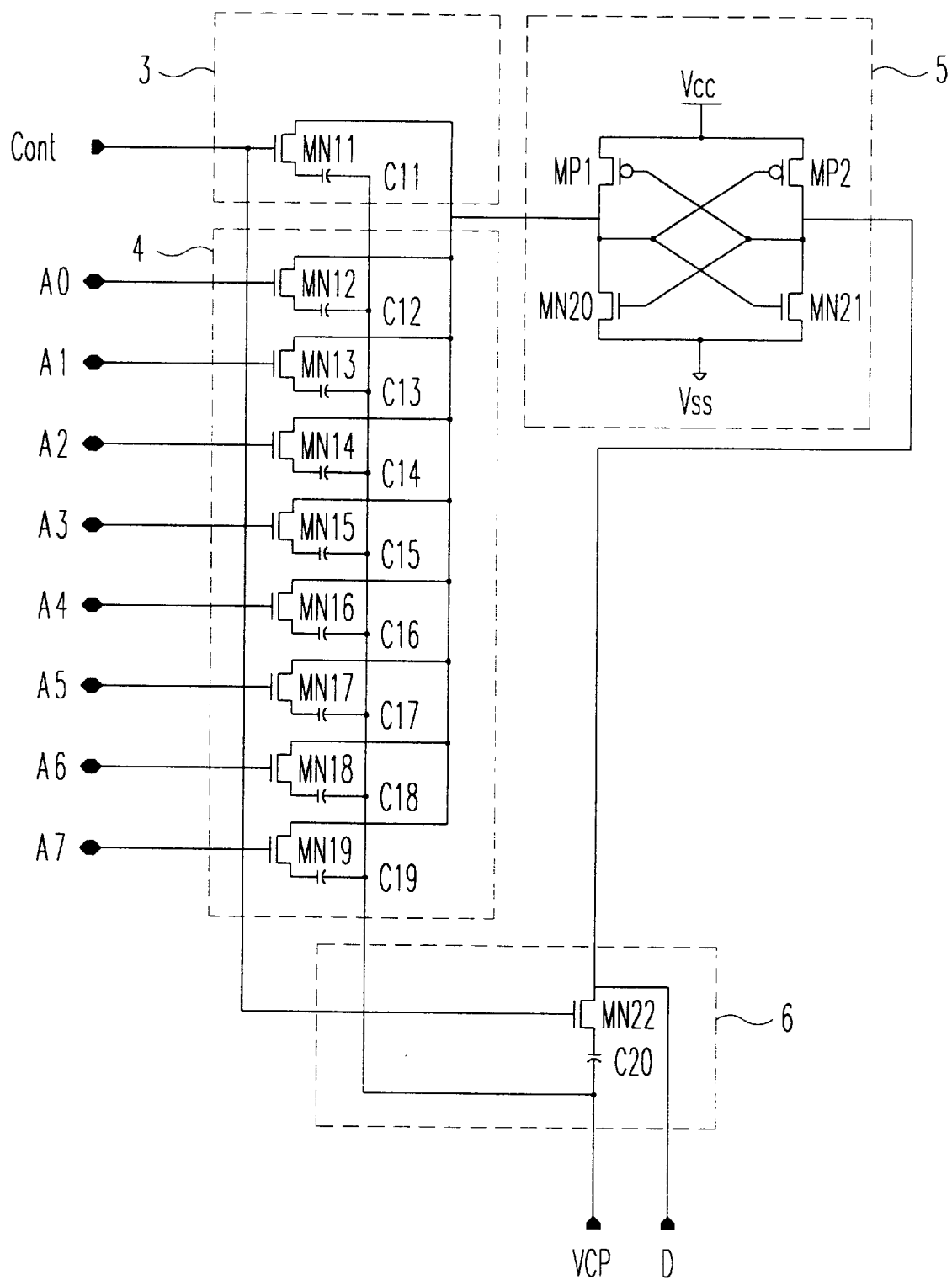
FIG. 2 is a circuit diagram illustrating a comparison voltage generation controller in accordance with a preferred embodiment of the present invention.

FIG. 2 is a circuit diagram illustrating a comparison voltage generation controller in accordance with a preferred embodiment of the present invention.

As shown in FIG. 2, the comparison voltage generation controller includes: a ferroelectric substance memory element 3 which is operated by a control signal Cont and outputs a stored data to one terminal of a comparison voltage amplifier 5; a silicon condenser 4 which is operated by a plurality of enable signals A0–A7, and outputs data stored in capacitors to one terminal of the comparison voltage amplifier 5; a ferroelectric substance memory element 6 which is operated by the control signal Cont, and outputs a stored data to other terminal of the comparison voltage amplifier 5; and a comparison voltage amplifier 5 which compares a total electric charge quantity of the ferroelectric substance memory element 3 and the silicon condenser 4 with an electric charge quantity of the ferroelectric substance memory element 6, amplifies a difference between them, and generates it.

The ferroelectric substance memory element 3 receiving the control signal Cont through a gate terminal includes: NMOS transistor MN11 which is connected between one terminal of the comparison voltage amplifier 5 and one terminal of a capacitor C11; and a capacitor C11 which is connected between a source terminal of the NMOS transistor MN11 and a cell plate voltage terminal VCP.

There is little difference between the silicon condenser 4 shown in FIG. 2 and that in FIG. 1, except that the silicon condenser 4 of FIG. 2 includes more transistors and more capacitors than that of FIG. 1.

The ferroelectric substance memory element 6 receiving the control signal Cont through a gate terminal includes: NMOS transistor MN22 which is connected between the other terminal of the comparison voltage amplifier 5 and one terminal of a capacitor C20; and a capacitor C20 which is connected between a source terminal of the NMOS transistor MN22 and the cell plate voltage terminal VCP.

The comparison voltage amplifier 5 is achieved by a latch structure wherein two inverters achieve a ring connection therebetween.

Referring to FIG. 2, the electric charge quantity stored in each capacitor of the silicon condenser 4 is one eighth (1/8) of the difference between the high electric charge quantity and the low electric charge quantity in the ferroelectric substance memory element.

In addition, according to the control signal Cont and an on/off operation of the signals A0–A7, a minimum value of the electric charge quantity generated from the silicon condenser 4 is identical with that of the ferroelectric substance memory element having a low electric charge quantity, and a maximum value of the electric charge quantity generated from the silicon condenser 4 is similar to that of the ferroelectric substance memory element having a high electric charge quantity.

In operation, a total electric charge quantity from an electric charge quantity generator comprised of the ferroelectric substance memory element 3 and the silicon condenser 4 is compared with the electric charge quantity (i.e, high electric charge quantity) of the ferroelectric substance memory element 6. If the ferroelectric substance memory element 6 has a high electric charge quantity, the ferroelectric substance memory element 6 outputs a "High" signal to a terminal D. On the contrary, if the ferroelectric substance memory element 6 has a low electric charge quantity, the ferroelectric substance memory element 6 outputs a "Low" signal to the terminal D. At this time, the cell plate voltage VCP is a voltage making an initial voltage state of condensers. The cell plate voltage VCP is about half (½) the external driving voltage. As stated above, total electric charge quantity generated from the electric charge quantity generator, and an electric charge quantity of the ferroelectric substance memory element 6 are input to both terminals of the comparison voltage amplifier 5, and are then compared therebetween. By comparing electric charge quantity, a "High" or "Low" signal is output to the output terminal D of the comparison voltage amplifier 5.

The operation relationship of FIG. 2 will now be described below in more detail. If the control signal Cont and a signal A0 are at a high level and the remaining signals A1–A7 are at a low level (i.e., A1–A7 are grounded), an electric charge quantity of the ferroelectric substance memory element 3 is added to that of a capacitor turned on by the signal A0. After that, the total electric charge quantity is input to one terminal of the comparison voltage amplifier 5, an electric charge quantity of the ferroelectric substance memory element 6 is input to the other terminal of the comparison voltage amplifier 5, they are compared therebetween and then amplified. The amplified voltage is generated as a "High" or "Low" state. If the electric charge quantity of the ferroelectric substance memory element 6 is larger than the total electric charge quantity of the ferroelectric substance memory element 3 and the silicon condenser 4, a "High" signal is generated. On the contrary, if the electric charge quantity of the ferroelectric substance memory element 6 is lower than the total electric charge quantity of the ferroelectric substance memory element 3 and the silicon condenser 4, a "Low" signal is generated.

As described above, the comparison voltage generation controller of FIG. 2 controls a comparison voltage generator of FIG. 1.

Likewise, if the control signal Cont and signals A0–A1 are at a high level and the remaining signals A2–A7 are at a low level (i.e., A2–A7 are grounded), the total electric charge quantity of the ferroelectric substance memory element 3 and the silicon condenser 4 increases as compared with the aforementioned case wherein only A0 is at a high level. Thus, if logic states of the signals A0–A7 are sequentially changed to a high state, an output electric charge quantity from the silicon condenser 4 is gradually increased.

FIG. 3 is a circuit diagram illustrating a variable comparison voltage generation apparatus which includes a plurality of comparison voltage generators and a plurality of comparison voltage generation controllers.

As shown in FIG. 3, the variable voltage generation apparatus includes: a variable comparison voltage generation controller 10 which is operated by predetermined signals VCP, Cont and Vss, and generates second variable comparison voltage generation control signals B0–B3; and a variable comparison voltage generator 20 which is operated by the second variable comparison voltage generation control signals B0–B3 and the predetermined signals VCP and Cont, and generates a variable comparison voltage.

The variable comparison voltage generation controller 10 includes: eight comparison voltage generation controllers which simultaneously receive a cell plate voltage VCP and a control signal Cont, and generate first variable voltage generation control signals D1–D8; four NAND gates which respectively receive two signals among the first variable voltage generation control signals D1–D8 of the eight comparison voltage generation controllers, perform a logic operation about the two signals, and output a result value of the logic operation to four input terminals of four inverters; and four inverters which invert four output signals of the four NAND gates, and generate second variable comparison voltage generation control signals B0–B3. The variable comparison voltage generator 20 includes five comparison voltage generators which simultaneously receive the second variable comparison voltage generation control signals B0–B3, the control signal Cont and the cell plate voltage VCP and generate a variable comparison voltage.

The variable comparison voltage generation controller 10 is comprised of the comparison voltage generation controllers shown in FIG. 2. Each of terminals Control and A0–A7 is connected to an external control signal Cont or is grounded. The comparison voltage generation controllers are connected to the control signal Cont. Also, a first comparison voltage generation controller connects one terminal A7 among the terminals A0–A7 to the control signal Cont, and connects the remaining terminals A0–A6 to a ground terminal. A second comparison voltage generation controller connects two terminals A7 and A6 among the terminals A0–A7 to the control signal Cont, and connects the remaining terminals A0–A5 to the ground terminal. A third comparison voltage generation controller connects three terminals A7, A6 and A5 among the terminals A0–A7 to the control signal Cont, and connects the remaining terminals A0–A4 to the ground terminal. In this way, the terminals A0–A7 are connected to the control signal Cont. Accordingly, an electric charge quantity generator's electric charge quantity which is compared with an electric charge quantity of the ferroelectric substance memory element having a high electric charge quantity in each comparison voltage generation controller, is to be changed. Herein, if the ferroelectric substance memory element having high electric charge quantity has much electric charge quantity, a "High" signal is output to the terminal D as stated in FIG. 2. Two adjacent output signals (D1–D2,D3–D4,D5–D6 and D7–D8) among output signals of the terminals D(D1–D8) are applied to each of the NAND gates ND1–ND4. Accordingly, if all NAND gates ND1–ND4 receive the "High" signal, the NAND gates ND1–ND4 generate a "Low" signal. Then, output signals of the NAND gates ND1–ND4 are applied to the inverters IV1–IV4. Output signals B0–B3 of the inverters IV1–IV4 are applied to the variable comparison voltage generator 20 shown in FIG. 1.

Figure 4:
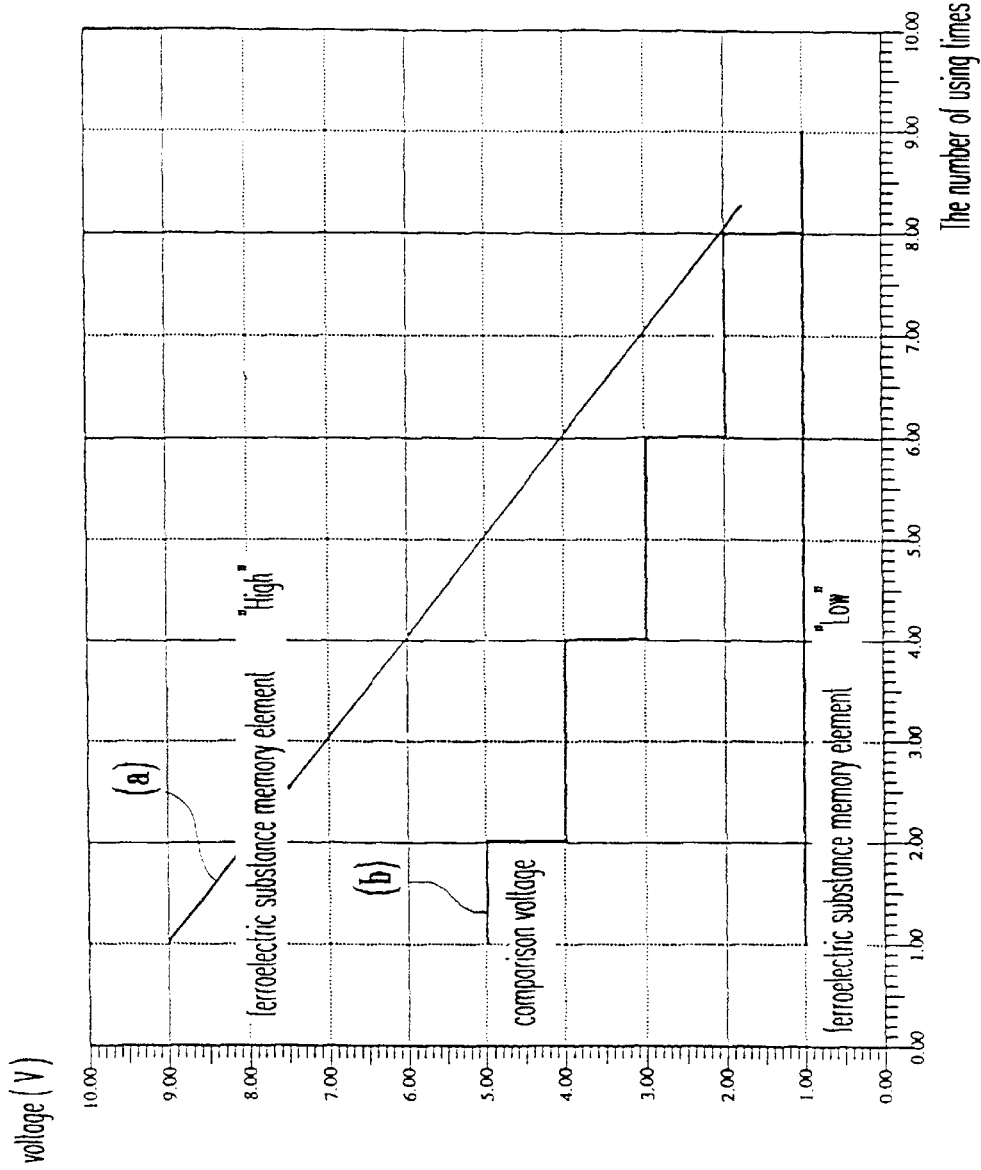
FIG. 4 is an operation timing diagram illustrating an operation relationship of the variable comparison voltage generation apparatus shown in FIG. 3.

FIG. 4 is an operation timing diagram illustrating an operation relationship of the variable comparison voltage generation apparatus shown in FIG. 3. As stated above, if an output voltage of the ferroelectric substance memory element having high electric charge quantity is lower than a predetermined level as shown in a section (a) of FIG. 4, seven output terminals among eight output terminals D1–D8 are to be in "High" state. Thus, only three switches among four switches B0–B3 of the comparison voltage generator 10 are turned on, thereby a comparison voltage Vref is discontinuously lowered as shown in a section (b) of FIG. 4. This value is maintained until six output terminals among eight output terminals D1–D8 reach the "High" state, because the ferroelectric substance memory element has a lower electric charge quantity with the lapse of time (i.e, as the number of using times increases) so a high state among output signals of the output terminals D1–D8 is gradually decreased. Continuously, if five output terminals among the output terminals D1–D8 are in a "High" state, only terminals B0–B2 are in a "High" state. Accordingly, a final comparison voltage Vref is discontinuously decreased. In this way, if the output voltage of the ferroelectric substance memory element is changed, a comparison voltage Vref is also changed in response to the changed voltage.

As described above, if the present invention is employed to a memory element, the present invention can maintain the stored information safely although the number of times the memory element is use is increased, it also enhances the reliability of an information storage, and increases durability of the memory element.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A variable comparison voltage generation apparatus which senses a variation of electric charge quantity in ferroelectric substance memory elements and generates a variable comparison voltage corresponding to the variation of electric charge quantity, the variable comparison voltage generation apparatus, comprising:

N variable comparison voltage generation controllers which sense the variation of electric charge quantity in the ferroelectric substance memory elements and generate N first logic signals; and a plurality of AND gates which receive two logic signals adjacent to each other among the N first logic signals and generate N/2 second logic signals; and a variable comparison voltage generator including: a plurality of switches which are turned on or off by the N/2 second logic signals being output signals of the And gates; capacitors which are connected to the switches; and another ferroelectric substance memory element which is operated by a predetermined control signal, whereby the variable comparison voltage is determined by the total electric charge quantity of an electric charge quantity from the capacitors connected to the switches turned on, and the other electric charge quantity from the another ferroelectric substance memory element.

2. The variable comparison voltage generation apparatus as set forth in claim 1, wherein each of the N variable comparison voltage generation controllers comprises:

a first ferroelectric substance memory element having a low electric charge quantity;

a second ferroelectric substance memory element having a high electric charge quantity;

a silicon condenser for generating N variable electric charge quantities by N control signals; and a voltage amplifier which includes a first input terminal commonly connected to an output terminal of the electric charge quantity of the first ferroelectric substance memory element and an output terminal of the variable electric charge quantity of the silicon condenser, and a second input terminal connected to an output terminal of the electric charge quantity of the second ferroelectric substance memory element, thereby comparing the electric charge quantity input to the first input terminal with the electric charge quantity input to the second input terminal, whereby an electric charge quantity generated from a silicon condenser of a first comparison voltage generation controller among the N comparison voltage generation controllers takes about 1/N of the difference between the electric charge quantity of the first ferroelectric substance memory element and the electric charge quantity of the second ferroelectric substance memory element, an electric charge quantity generated from a silicon condenser of a second comparison voltage generation controller among the N comparison voltage generation controllers takes about 2/N of the difference between the electric charge quantity of the first ferroelectric substance memory element and the electric charge quantity of the second ferroelectric substance memory element, . . . , and an electric charge quantity generated from a silicon condenser of a N-th comparison voltage generation controller among the N comparison voltage generation controllers takes about N/N of the difference between the electric charge quantity of the first ferroelectric substance memory element and the electric charge quantity of the second ferroelectric substance memory element.

3. The variable comparison voltage generation apparatus as set forth in claim 2, wherein the second input terminal of the voltage amplifier is connected to the comparison voltage generation controller's output terminal generating the first logic signal.

4. The variable comparison voltage generation apparatus as set forth in claim 2, in which:

a maximum electric charge quantity generated from the silicon condenser generating N variable electric charge quantities is similar to the electric charge quantity of the second ferroelectric substance memory element, and a minimum electric charge quantity generated from the silicon condenser is similar to the electric charge quantity of the first ferroelectric substance memory element.

5. The variable comparison voltage generation apparatus as set forth in claim 2, wherein:

the silicon condenser generating the N variable electric charge quantities includes N capacitors, an output electric charge quantity of each of the N capacitors takes 1/N of the difference between the electric charge quantity of the first ferroelectric substance memory element and the electric charge quantity of the second ferroelectric substance memory element.

6. The variable comparison voltage generation apparatus as set forth in claim 1, wherein the number of the variable comparison voltage generators is at least one.

7. The variable comparison voltage generation apparatus as set forth in claim 2, wherein the voltage generation apparatus is a latch having two inverters.

* * * * *